(12) United States Patent
Loubet et al.

(10) Patent No.: US 9,230,991 B2
(45) Date of Patent: Jan. 5, 2016

(54) METHOD TO CO-INTEGRATE OPPOSITELY STRAINED SEMICONDUCTOR DEVICES ON A SAME SUBSTRATE

(71) Applicants: STMicroelectronics, Inc., Coppell, TX (US); Commissariat á l'Énergie Atomique et aux Énergies Alternatives, Paris (FR)

(72) Inventors: Nicolas Loubet, Guilderland, NY (US); Sylvain Maitrejean, Paris (FR); Romain Wacquez, Marseilles (FR)

(73) Assignees: STMICROELECTRONICS, INC., Coppell, TX (US); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/253,904

(22) Filed: Apr. 16, 2014

(65) Prior Publication Data

US 2015/0303218 A1    Oct. 22, 2015

(51) Int. Cl.
| | |
|---|---|
| *H01L 23/48* | (2006.01) |
| *H01L 27/12* | (2006.01) |
| *H01L 21/84* | (2006.01) |
| *H01L 29/16* | (2006.01) |
| *H01L 29/161* | (2006.01) |
| *H01L 29/165* | (2006.01) |
| *H01L 27/092* | (2006.01) |
| *H01L 21/8238* | (2006.01) |
| *H01L 29/78* | (2006.01) |
| *H01L 29/06* | (2006.01) |
| *H01L 21/762* | (2006.01) |
| *H01L 21/265* | (2006.01) |
| *H01L 21/324* | (2006.01) |
| *H01L 21/02* | (2006.01) |
| *H01L 21/266* | (2006.01) |
| *H01L 21/306* | (2006.01) |

(52) U.S. Cl.
CPC ...... *H01L 27/1211* (2013.01); *H01L 21/02381* (2013.01); *H01L 21/02529* (2013.01); *H01L 21/02532* (2013.01); *H01L 21/266* (2013.01); *H01L 21/26506* (2013.01); *H01L 21/306* (2013.01); *H01L 21/30604* (2013.01); *H01L 21/324* (2013.01); *H01L 21/76224* (2013.01); *H01L 21/823807* (2013.01); *H01L 21/823814* (2013.01); *H01L 21/823821* (2013.01); *H01L 21/823878* (2013.01); *H01L 21/845* (2013.01); *H01L 27/0922* (2013.01); *H01L 27/0924* (2013.01); *H01L 29/0649* (2013.01); *H01L 29/161* (2013.01); *H01L 29/165* (2013.01); *H01L 29/1608* (2013.01); *H01L 29/7848* (2013.01)

(58) Field of Classification Search
USPC .......................................................... 257/211
See application file for complete search history.

(56) References Cited

U.S. PATENT DOCUMENTS

| | | | |
|---|---|---|---|
| 2012/0068267 A1* | 3/2012 | Bedell et al. | 257/350 |
| 2014/0110791 A1* | 4/2014 | Clark | 257/369 |
| 2014/0284769 A1 | 9/2014 | Halimaoui et al. | |

*Primary Examiner* — Thao P Le
(74) *Attorney, Agent, or Firm* — Allen, Dyer, Doppelt, Milbrath & Gilchrist, P.A. Attorneys at Law (57) ABSTRACT

Methods and structures for forming localized, differently-strained regions in a semiconductor layer on a substrate are described. An initial, unstrained, semiconductor-on-insulator substrate may be processed to form the differently-strained regions in the original semiconductor layer. The differently-strained regions may have opposite types of strain. The strains in the different regions may be formed independently.

13 Claims, 7 Drawing Sheets

METHOD TO CO-INTEGRATE OPPOSITELY STRAINED SEMICONDUCTOR DEVICES ON A SAME SUBSTRATE

BACKGROUND

1. Technical Field

The technology relates to methods and structures for co-integrating semiconductor devices, such as strained-channel CMOS FETs, on a same substrate.

2. Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the body of the transistor (which lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

The described technology relates to methods and structures for making localized, differently-strained regions of semiconductor at a same layer of a substrate. The technology may be used to form strained-channel, field-effect transistors. In various embodiments, the differently-strained regions have opposite types of strain (compressive and tensile), and may be adjacent to each other. The differently-strained regions may be formed in a thin, initially unstrained semiconductor layer of a semiconductor-on-insulator substrate, according to some embodiments. A first strained region may be formed by an amorphization and recrystallization process, and a second strained region may be formed by a regrowth and conversion process.

According to some embodiments, a method for forming differently-strained regions of semiconductor on a substrate may comprise acts of forming a first semiconductor layer over a second semiconductor layer, wherein the first semiconductor layer forms under a first strain. The method may further include implanting ions into a first region and not a second region of the second semiconductor layer, wherein the implanted ions amorphize the first region of the second semiconductor layer. The implanted ions may not amorphize the second region of the second semiconductor layer. The method may further include recrystallizing the first region of the second semiconductor layer to form a second strain in the first region, removing the first semiconductor layer, and forming a third semiconductor layer in contact with the second region and not in contact with the first region. In some aspects, recrystallizing comprises annealing the substrate at a temperature between about 500° C. and about 1100° C. The third semiconductor layer may be of a different chemical composition from the second semiconductor layer. In some aspects, the third layer may be formed by epitaxial growth. In some embodiments, the method further comprises heating the substrate to condense a chemical component from the third semiconductor layer into the second region of the second semiconductor layer to form a third strain in the second region that is different from the second strain. In some aspects, heating the substrate comprises oxidizing the third semiconductor layer. In some implementations, the second strain is of an opposite type than the third strain.

According to some embodiments, a method for forming differently-strained regions of semiconductor on a substrate may comprise acts of forming a first semiconductor layer over a second semiconductor layer, wherein the first semiconductor layer forms under a first strain, and implanting ions into a first region and not a second region of the second semiconductor layer. In various embodiments, the implanted ions amorphize the first region of the second semiconductor layer. The first region may be immediately adjacent to the second region. The method may further comprise recrystallizing the first region of the second semiconductor layer to form a second strain in the first region, and removing the first semiconductor layer. In some aspects, recrystallizing comprises annealing the substrate at a temperature between about 500° C. and about 1100° C. The method may further comprise thinning the second semiconductor layer to a thickness between about 5 nm and about 30 nm, and heating the substrate to condense a chemical component into the second region of the second semiconductor layer to form a third strain in the second region that is different from the second strain. Prior to heating the substrate, a third layer of semiconductor material may be formed only over the second region. The third semiconductor layer may be of a different chemical composition from the second semiconductor layer. In some aspects, the third layer may be formed by epitaxial growth. In some aspects, heating the substrate comprises oxidizing the third semiconductor layer. In some implementations, a trench may be etched through the second semiconductor layer between the first region and second region after the act of heating the substrate.

According to some embodiments, a method for forming differently strained regions of semiconductor on a substrate may comprise forming a first semiconductor layer over a second semiconductor layer at a first area of the substrate, wherein the first semiconductor layer forms under a first strain, and forming a third semiconductor layer over the second semiconductor layer at a second area of the substrate, wherein the third semiconductor layer forms under a second strain. The method may further include mplanting ions into a first region of the second semiconductor layer at the first area and into a second region of the second semiconductor layer at the second area, wherein the implanted ions amorphize the first region and second region of the second semiconductor layer. In some embodiments, a method for forming differently strained regions of semiconductor comprises recrystallizing the first region and second region of the second semiconductor layer to form a third strain in the first region and a fourth strain in the second region.

In some aspects, the second semiconductor layer may be disposed on an insulating layer. The insulating layer may comprise an oxide or nitride having a thickness between about 5 nm and about 200 nm. In some implementations, the insulating layer is an ultrathin buried oxide layer that is used to form an ultra-thin body and buried oxide (UTBB) device.

According to some aspects, the second semiconductor layer has a thickness between approximately 5 nm and approximately 60 nm. The first semiconductor layer may have a first lattice constant that differs from a second lattice constant of the second semiconductor layer. In some implementations, the first semiconductor layer comprises a SiGe or SiC layer and the second semiconductor layer comprises a Si layer. In some aspects, the first and third strains formed in the first and third semiconductor layers are compressive strain, and the second strain is tensile strain. In some aspects, the first and third strains formed in the first and third semiconductor layers are tensile strain, and the second strain is compressive strain.

According to some aspects, methods of fabricating differently-strained regions of semiconductor may further comprise doping the first or second region to be of a first conductivity type that is opposite a second conductivity type of the respective second or first region. A method may further comprise doping the first region to be of n-type conductivity or doping the second region to be of p-type conductivity. In some aspects, the third layer and first layer are formed of same chemical species.

According to some implementations, a concentration of the chemical species in the third layer differs from a concentration of the chemical species in the first layer. In some aspects a concentration of a chemical species in the third layer before being condensed into the second region of the first layer is higher than a concentration of a same chemical species in the first layer.

In some implementations, methods of fabricating differently-strained regions of semiconductor may further comprise forming the first semiconductor layer by epitaxial growth. A method may further include forming an ion blocking mask over the second region prior to implanting ions. In some aspects, a method of fabricating differently-strained regions may further comprise thinning the second semiconductor layer by an oxidation process after removing the first semiconductor layer. The second semiconductor layer may be thinned to a thickness between approximately 5 nm and approximately 30 nm. A method may further comprise forming a mask over the first region prior to forming the third semiconductor layer, wherein the mask blocks the formation of the third semiconductor layer over the first region.

According to some aspects, methods of fabricating differently-strained regions of semiconductor may further comprise etching a trench through the second semiconductor layer between the first region and second region after heating the substrate, and filling the trench with an insulating material. In some implementations, a method may further comprise forming at least one n-channel FD-SOI FET in the first region, and forming at least one p-channel FD-SOI FET in the second region. The channel length of at least one FD-SOI FET may be less than about 30 nm in some cases, and less than about 15 nm in some cases. In some implementations, methods of fabricating differently-strained regions of semiconductor may further comprise forming gate structures for FD-SOI FETs using a self-aligned, double-patterning or sidewall-image-transfer lithography process.

In some implementations, methods of fabricating differently-strained regions of semiconductor may further comprise forming at least one n-channel finFET in the first region, and forming at least one p-channel finFET in the second region. The width of a fin for at least one finFET may be less than about 30 nm in some cases, less than about 15 nm in some cases, and yet less than about 10 nm in some cases. In some implementations, methods of fabricating differently-strained regions of semiconductor may further comprise forming fin structures for finFETs using a self-aligned, double-patterning or sidewall-image-transfer lithography process.

The foregoing aspects and implementations of acts may be included in any suitable combination in a method for fabricating differently-strained regions of semiconductor layer.

Structures and devices associated with the methods are also contemplated. According to some embodiments, a substrate comprises a first region having a first strain in a first semiconductor layer that is disposed on an insulating layer; and a second region in the first semiconductor layer having a second strain. The second region of the first semiconductor layer may have a chemical composition different from that of the first region, and the type of strain in the second region may be opposite the type of strain in the first region. In some embodiments, a magnitude of the second strain is greater than a magnitude of the first strain.

According to some aspects, the second region comprises a diffusive chemical species having a concentration in the second region of more than approximately 30%. In some aspects, the second region comprises a diffusive chemical species having a concentration in the second region of more than approximately 50%.

In some implementations, a substrate may further comprise at least one n-channel finFET formed in the first region, and at least one p-channel finFET formed in the second region. In some aspects, the first type of strain in the first region is tensile and the second type of strain is compressive. A width of at least one fin may be less than about 30 nm, in some aspects.

In some aspects, the chemical composition of the first region comprises Si (where "Si" is used to denote pure silicon or silicon doped for a particular conductivity). In some implementations, the chemical composition of the second region comprises a compound semiconductor.

According to some aspects, a substrate may further comprise at least one n-channel FD-SOI FET formed in the first region, and at least one p-channel FD-SOI FET formed in the second region. In some implementations, the first type of strain is tensile and the second type of strain is compressive. A channel length of at least one FD-SOI FET may be less than about 30 nm, in some aspects.

According to some embodiments, a substrate comprises a first region in a first semiconductor layer disposed on an insulating layer having a first strain, and a second region in the first semiconductor layer having a second strain different from the first strain. In some aspects, the second region of the first semiconductor layer has a chemical composition different from that of the first region. A substrate may further comprise a third semiconductor layer formed in contact with the second region and not the first region. The third semiconductor layer may have a chemical component that is also present in the second region of the first semiconductor layer, and is not present in the first region of the first semiconductor layer.

In some implementations, the substrate may comprise an oxide layer formed at a surface of the third semiconductor layer that is opposite a surface of the third semiconductor layer that is in contact with the second region in the first semiconductor layer. The third semiconductor layer may comprise a compound semiconductor. According to some aspects, the third semiconductor layer comprises SiGe or SiC, and the first region comprises Si.

The foregoing implementations and aspects relating to a substrate structures may be included in any suitable combination for one or more embodiments of a substrate containing differently-strained regions of a same semiconductor layer. Any of the above-described method embodiments may be used to fabricate any embodiment of a substrate containing differently-strained regions.

The foregoing and other aspects, implementations, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1:
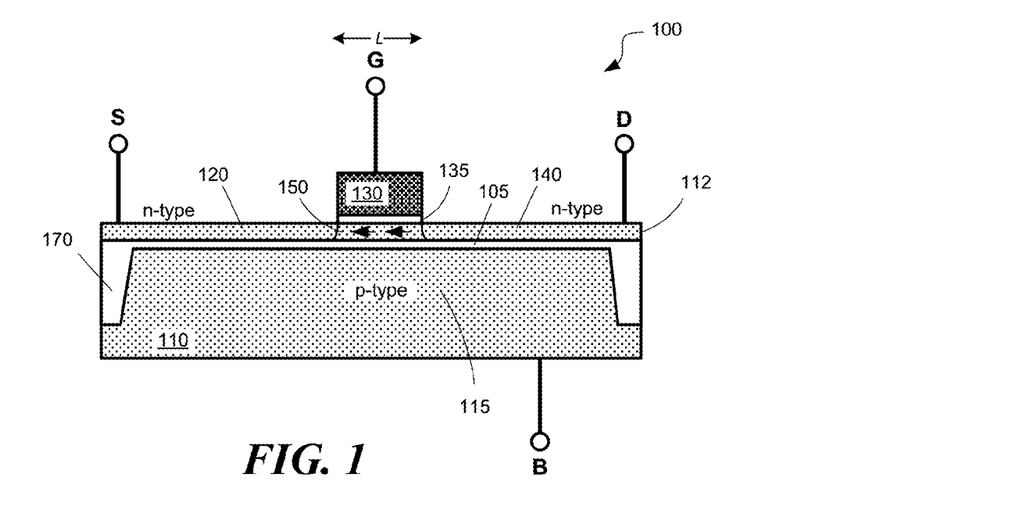
FIG. 1 is an elevation view depicting a FD-SOI FET, according to some embodiments.

An example of a fully-depleted silicon-on-insulator (FD-SOI) FET 100 is depicted in FIG. 1, according to some embodiments. The FD-SOI FET may comprise a source region 120, a gate structure 130, 135, a drain region 140, and a channel region 150. The source, channel region, and drain may be formed in a thin semiconductor layer 112 that is formed adjacent a thin insulating layer 105 or buried oxide layer 105. The thin insulating layer may be formed adjacent a substrate 110. In some implementations, the semiconductor layer 112 and insulating layer 105 are ultrathin, e.g., less than about 20 nm. Such devices may be referred to as ultra-thin body and buried oxide (UTBB) devices. In a UTBB structure, the thin insulating layer 105 may be less than about 30 nm in thickness, with a preferred thickness of about 25 nm for some embodiments, and the semiconductor layer 112 may be less than about 10 nm, with a preferred thickness of about 7 nm for some embodiments, for example. In some embodiments, trench isolation structures 170 comprising electrically-insulating material may be formed around one or more FD-SOI FETs. The gate structure may comprise a gate conductor 130 and a thin gate insulator 135. According to some embodiments, integrated source S, gate G, drain D, and body B interconnects may be formed to provide electrical connections to the source, gate, drain, and back body regions of the FD-SOI FET.

In some embodiments, the source region 120 and drain region 140 of a FD-SOI FET may be doped with acceptor or donor impurities to form regions of a first conductivity type (e.g., p-type or n-type). The channel region 150 may be doped to be of an opposite conductivity type, and may be of a same conductivity type as a back body region 115 (e.g., partially-depleted SOI or PD-SOI). In some implementations, the channel region 150 may be undoped (FD-SOI). A FD-SOI FET can exhibit reduced leakage currents compared to bulk FET devices and offer flexible bias strategies for improving speed or reducing threshold voltages for low-voltage applications.

Figure 2A:
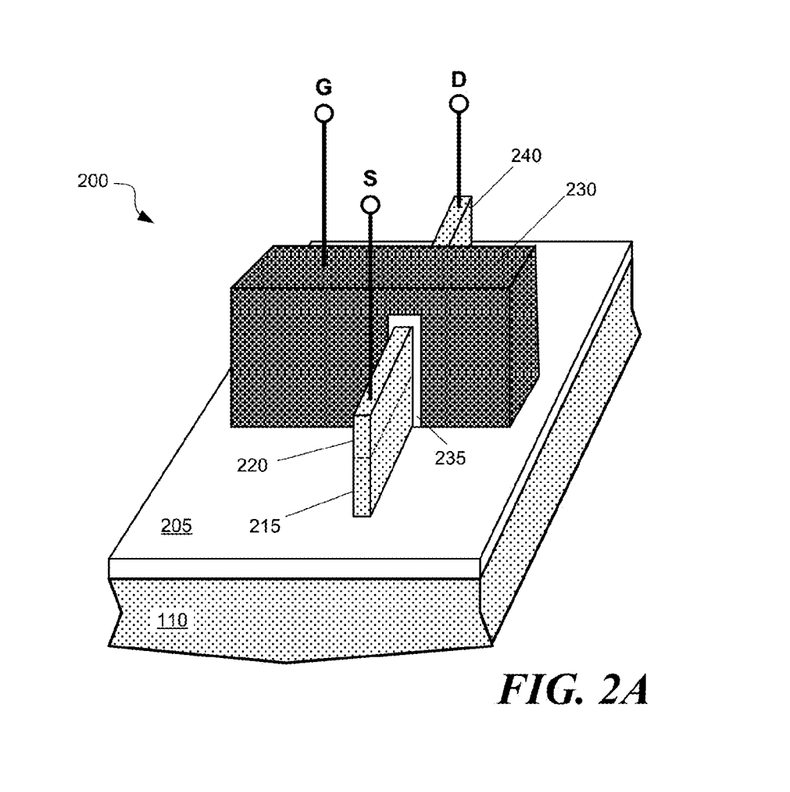
FIG. 2A is a perspective view depicting a finFET, according to some embodiments.

An example of a finFET 200 is depicted in the perspective view of FIG. 2A, according to some embodiments. A finFET may be fabricated on a bulk semiconductor substrate 110, e.g., a silicon substrate, and comprise a fin-like structure 215 that runs in a length direction along a surface of the substrate and extends in a height direction normal to the substrate surface. The fin 215 may have a narrow width, e.g., less than 50 nanometers. There may be an electrically-insulating layer 205, e.g., an oxide layer, on a surface of the substrate 110. The fin may pass through the insulating layer 205, but be attached to the semiconducting substrate 110 at a lower region of the fin. A gate structure comprising a conductive gate material 230 (e.g., polysilicon) and a gate insulator 235 (e.g., an oxide or a high dielectric constant material) may be formed over a region of the fin. The finFET may further include a source region 220 and drain region 240 adjacent to the gate. A finFET may also include integrated source S, gate G, drain D, and body B (not shown) interconnects to provide electrical connections to the source, gate, drain, and back body regions of the device.

FinFETs like those depicted in FIG. 2A exhibit favorable electrostatic properties for scaling to high-density, low-power, integrated circuits. Because the fin and channel are raised from the substrate, the devices can exhibit reduced cross-coupling between proximal devices. For the device shown in FIG. 2A, the fin 215 may be formed from the bulk substrate 110 by an etching process, and is therefore attached to the substrate at a base region of the fin, a region occluded in the drawing by the adjacent insulator 205. The insulator 205 may be formed after the etching of the fin 215. Because the fin 215 is attached to the semiconductor substrate, leakage current and cross-coupling may occur via the base region of the fin.

Figure 2B:
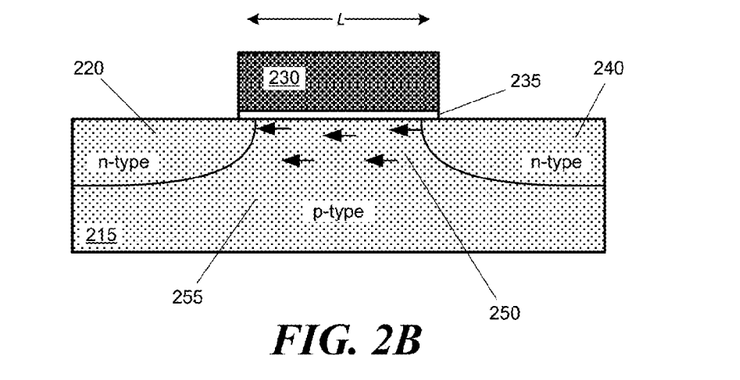
FIGS. 2B-2E depict cross-sectional views of finFET fins, according to various embodiments.
Figure 2C:
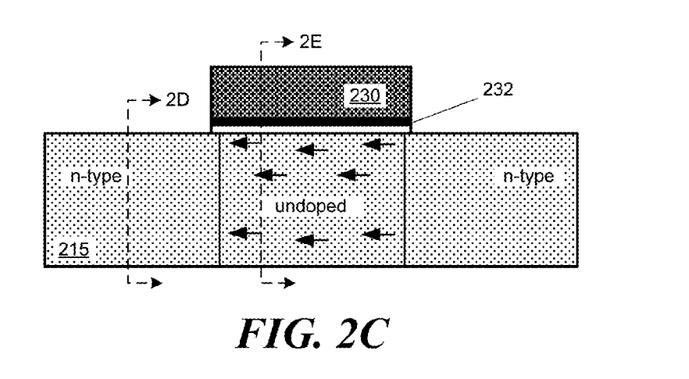

Source, channel, and drain regions of a finFET may be doped with donor or acceptor impurities to create different regions of different conductivity types, as depicted in FIGS. 2B-2C. Several different configurations of source, channel, and drain regions are possible. According to some embodiments, source region 220 and drain region 240 may be doped to be of a first conductivity type and the channel region 250 may be doped to be of an opposite conductivity type, as depicted in FIG. 2B. The terms "source region" and "drain region" as used may include extension regions of the fins that lie between source and drain contact regions and the channel region of the finFET device.

Figure 2D:
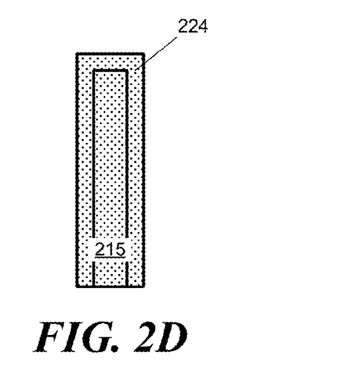

The finFET may further include a body region 255 that may be of a same conductivity type as the channel region. In some embodiments, a channel region 250 of a finFET may be undoped, as depicted in FIG. 2C. The doping of source and drain regions in a finFET may be of various geometries. As depicted in FIG. 2B, vertical portions of the fin 215 may be doped to form source 220 and drain 240 regions. Alternatively, according to some embodiments, outer sheath portions 224 of a fin 215 may be doped to form source and drain regions, as depicted in FIGS. 2C-2E.

Figure 2E:
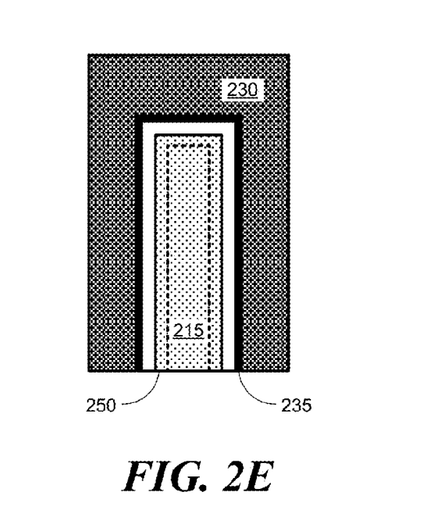

FIG. 2C and FIG. 2E depict a three-dimensional nature of a channel region 250 in a finFET, according to some embodiments. In some embodiments, the entire fin portion encased by the gate structure may be inverted and form a bulk channel rather than a surface channel. A metallic film 232 may be deposited between a gate electrode 230 and gate oxide 235 in some implementations to improve gate conductance and gate switching speeds.

The inventors have conceived of methods and structures for straining different regions of a same semiconductor layer on a substrate to have different amounts and/or opposite types of strain. For example, a first region of a layer may be processed such that it forms tensile strain, and a second region of the same layer may be processed such that it forms compressive strain. The strained regions may be used to further improve the performance finFET and FD-SOI FET devices.

Induced strain in a channel region of a transistor may improve the mobility of carriers in the channel regions, and thereby improve device speed. For example compressive straining of silicon (Si) can improve the hole mobility within silicon. Tensile straining of Si can improve electron mobility. When enough strain is applied, the performance of silicon-based transistor devices can approach or even surpass the performance of devices based on compound semiconductors (e.g., SiGe, SiC, GaAs, InP, InGaAs, GaN, AlGaAs, etc.), which may require more difficult and expensive processing techniques.

FIGS. 3A-3M depict structures associated with microfabrication process steps used for forming co-integrated regions of differently-strained semiconductor in a same layer on a substrate. The illustrated steps depict how the straining techniques can be applied to semiconductor-on-insulator substrates that may be used in the fabrication of FD-SOI and finFET devices. It will be appreciated that the described steps may be applied to other devices that would benefit from a mechanically strained region of a substrate.

Figure 3A:
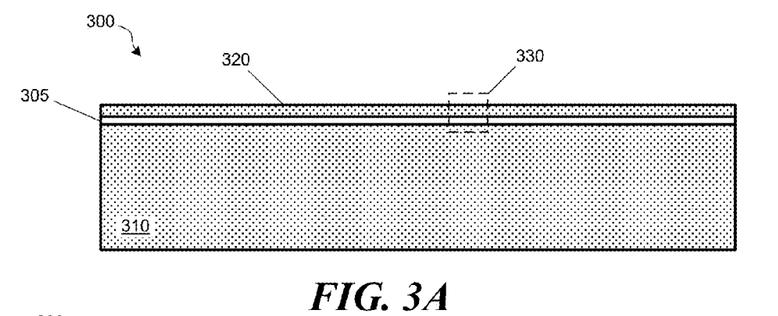
FIGS. 3A-3M depicts structures associated with process steps for forming co-integrated regions of differently-strained semiconductor on a substrate, according to some embodiments.

Referring now to FIG. 3A, a substrate 300 may be obtained or formed for fabricating co-integrated regions of differently-strained semiconductor material. The substrate 300 may comprise a bulk material 310, an insulating layer 305, and a base layer of semiconductor material 320 disposed on the insulating layer. In some embodiments, the substrate 300 may comprise a silicon-on-insulator (SOI) substrate, or may comprise a bulk semiconductor with one or more epitaxial layers formed at a surface. The bulk material 310 may be formed from any suitable semiconductor substrate (e.g., Si, SiGe, SiC, Ge, GaN, GaAs, AlGaAs, InGaP, etc.) in some embodiments, or may be formed from another type of substrate (e.g., ceramic, optical glass, electro-optical material) in other embodiments. According to some embodiments bulk material 310 may be a substantially pure bulk semiconductor substrate such as silicon (Si) or doped Si, though in other embodiments the bulk substrate may be a compound semiconductor. In some implementations, the bulk material 310 may contain multiple layers of different materials or similar materials.

According to some embodiments, the substrate 300 may be in the form of a semiconductor wafer, having a diameter of at least 100 mm. In some cases, the diameter of the substrate may be larger than 400 mm. In some embodiments, the substrate 300 may be in the form of a chip with a maximum lateral dimension less than about 100 mm. The substrate may be formed in other sizes and shapes in some embodiments.

The insulating layer 305 may comprise an oxide or a nitride. In some embodiments, the insulating layer may comprise a high-dielectric constant material (high-k material), such as hafnium silicate, zirconium silicate, hafnium dioxide and zirconium dioxide. In some implementations, the insulating layer may have a thickness between 5 nm and 30 nm. In other embodiments, the insulating layer 305 may have a thickness between 30 nm and 200 nm. In some embodiments, the insulating layer 305 may comprise an ultra-thin buried oxide layer (e.g., an insulating material less than about 12 nm thick) that is used for the fabrication of ultra-thin body and buried oxide (UTBB) FETs or FD-SOI FETs. The insulating layer 305 may be formed by any suitable deposition process (e.g., a thermal oxidation process, and atomic layer deposition process, a chemical vapor deposition process, etc.), and may be annealed in some embodiments to improve the quality of the insulator. The insulating layer 305 may have a substantially uniform thickness across the substrate 300, or at least across a region of the substrate.

In various embodiments, the semiconductor layer 320 may be disposed on the insulating layer 305. The semiconductor layer 320 may be a substantially pure semiconductor or compound semiconductor material suitable for integrated circuit fabrication. The semiconductor layer 320 may comprise any suitable semiconductor material (e.g., Si, SiGe, SiC, Ge, GaN, GaAs, AlGaAs, InGaP, etc.), and have a thickness between approximately 5 nm and approximately 60 nm, according to some embodiments. In some implementations, the semiconductor layer 320 is initially formed at a thickness of at least 30 nm, and later thinned to a thickness less than 30 nm. In some implementations, the semiconductor layer 320 is initially formed at a thickness of at least 60 nm, and later thinned to a thickness approximately equal to or less than 60 nm. According to some embodiments, the semiconductor layer 320 is formed as a substantially monocrystalline layer of semiconductor material having a low defect density. For example, it may have a defect density less than approximately $10^6$ cm$^{-2}$.

Figure 3B:
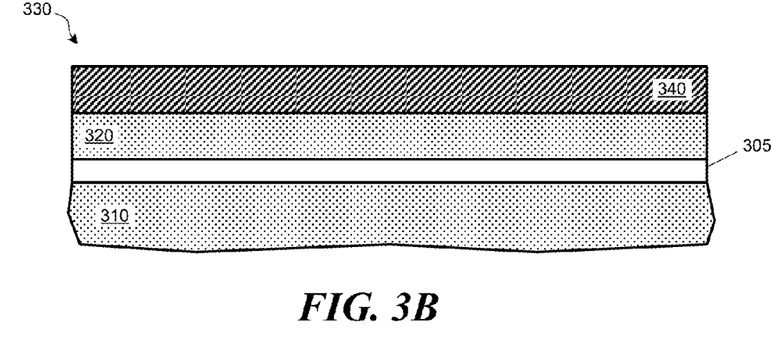

According to some embodiments, a first overgrowth semiconductor layer 340 may be formed on the semiconductor layer 320 in at least one region 330 of the substrate 300, as depicted in FIG. 3B. For purposes of describing a fabrication method associated with FIGS. 3A-3M, semiconductor layer 320 may be referred to as a base semiconductor layer 320. The first overgrowth semiconductor layer 340 may have a chemical composition that is different from the base semiconductor layer 320. In some implementations, the first overgrowth semiconductor layer 340 may comprise SiC or SiGe, whereas the base semiconductor layer 320 may comprise Si, though other combinations of semiconductor materials may be used and their orders may be reversed on the substrate in other embodiments. The first overgrowth semiconductor layer 340 may be formed by any suitable deposition process, such as epitaxial growth or atomic layer deposition.

In some embodiments, the first overgrowth semiconductor layer 340 forms under strain when it is deposited on the base semiconductor layer 320. For example, there may be a lattice mismatch between the crystal lattice of first overgrowth semiconductor layer 340 in the base semiconductor layer 320. As the first overgrowth semiconductor layer forms, its individual atoms may register to the underlying atoms of the base semiconductor layer 320, such that strain is induced in the first overgrowth semiconductor layer 340. As an example, in some embodiments, the first overgrowth layer 340 may comprise SiGe, and the base semiconductor layer 320 may comprise Si. According to this embodiment, the first overgrowth layer may form under compressive stress. As another example, the first overgrowth layer 340 may comprise SiC, and the base semiconductor layer 320 may comprise Si. In this embodiment, the first overgrowth layer may form under tensile stress.

In various implementations, the base semiconductor layer 320 should be of sufficient thickness so that it can withstand and support the strain formed in the first overgrowth semiconductor layer 340. For example, the base semiconductor layer may have a thickness that is approximately equal to or greater than the thickness of the first overgrowth semiconductor layer 340. According to some embodiments, the thickness of the base semiconductor layer 320 is between 30 nm and approximately 100 nm. In some implementations, the thickness of the base semiconductor layer 320 may be less than the thickness of the first overgrowth semiconductor layer 340. For example, the base semiconductor layer 320 may have a thickness that is between 30% and 100% of the thickness of the first overgrowth semiconductor layer 340. According to one embodiment, a base semiconductor layer 320 is about 7 nm thick, and the first overgrowth semiconductor layer 340 is about 20 nm thick.

Figure 3C:
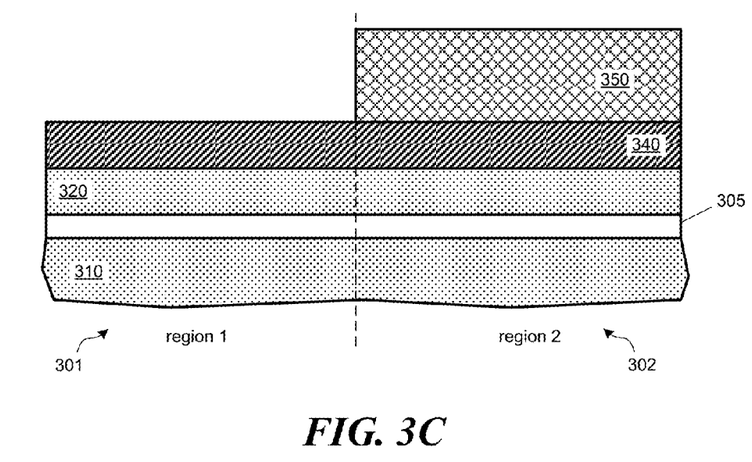

According to some embodiments, and ion blocking mask 350 may be formed over the first overgrowth layer 340, as depicted in FIG. 3C. The ion blocking mask 350 may be formed by any suitable lithographic process. For example, the ion blocking mask may be formed by first depositing a photoresist, and subsequently exposing and developing the photoresist using optical lithography techniques. In various embodiments, the ion blocking mask 350 may be formed over the second region 302 and not formed over a first region 301 of the substrate 300. By forming the ion blocking mask selectively over some regions of the substrate and not other regions, the substrate 300 may be partitioned into at least two regions as depicted in FIG. 3C. For the entire substrate, there may be hundreds, thousands, or more partitioned regions.

The ion blocking mask 350 may be formed of any suitable material, which may include a photoresist, a polymer, or a hard mask such as an oxide, a nitride, or polySi. Other materials may be used in other embodiments. A hard mask or polymer may be patterned by first coating at least the entire region 330 with a hard mask material or polymer, and subsequently forming a photoresist over the hard mask material or polymer. The photoresist may be patterned, and the pattern transferred to the hard mask or polymer. For example, the photoresist may be patterned to expose the hard mask or polymer in the first region 301, and the hard mask or polymer may be removed from the first region by an etching process, such as reactive ion etching (RIE) to expose the first overgrowth layer 340 in the first region 301.

Figure 3D:
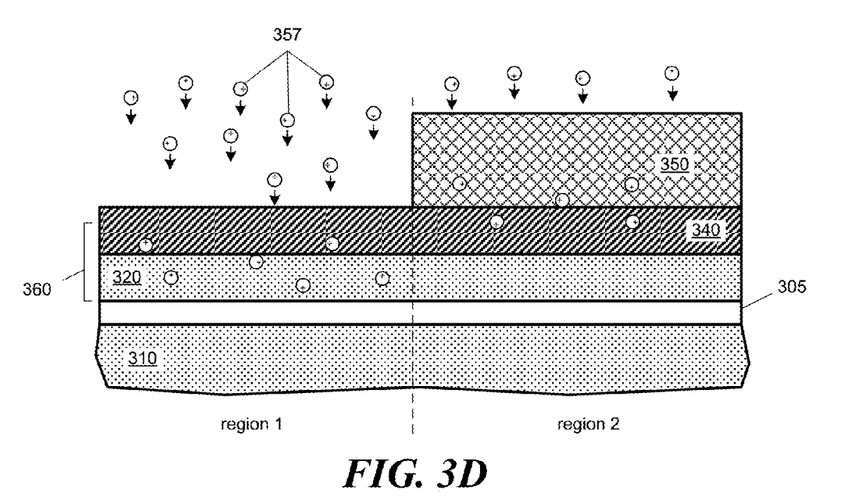

After the ion blocking mask 350 has been formed, according to some embodiments the substrate 300 may be exposed to an ion implantation step, as to depicted in FIG. 3D. According to some embodiments, an ion implantation step may comprise implanting ions such as Si and or Ge into the substrate 300, though other ions may be used in other embodiments. The ions 357 may be accelerated toward the substrate under the influence of an electric field. In various embodiments, the ions 357 will implant into the substrate 300 in the exposed region 301. In the exposed region, the ions 357 will enter the first overgrowth semiconductor layer 340 and also penetrate into the base semiconductor layer 320. In this first region 301, the majority of the ions will be stopped before they reach the insulating layer 305. In some embodiments, all ions 357 will stop before reaching the insulating layer 305.

Figure 3E:
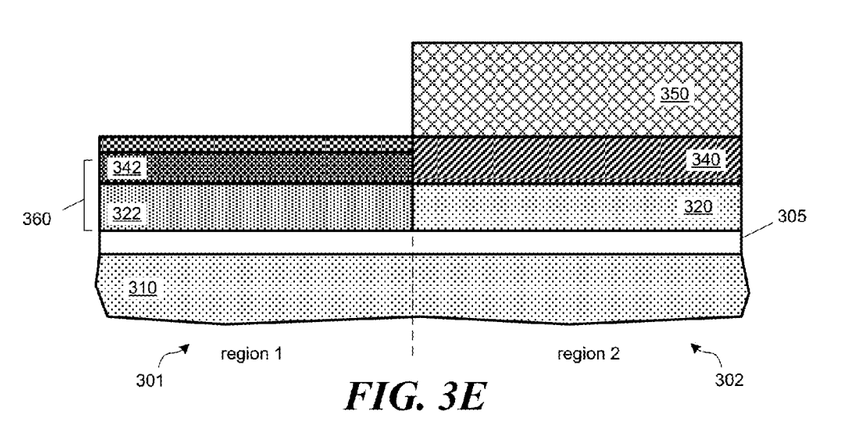

In various embodiments, a majority of the implanted ions 357 will stop within the base semiconductor layer 320, and disrupt the crystal lattice in the base semiconductor layer 320. Accordingly, the base semiconductor layer 320 in the first region 301 will become an amorphous region 322 of semiconductor material, as depicted in FIG. 3E. Additionally, a portion of the first overgrowth layer may also become an amorphous region 342. Since at least an amorphous region 322 of the base semiconductor layer 320 is formed, an upper region 344 of the first overgrowth layer will relax to relieve the strain in the first region 301 of the first overgrowth semiconductor layer 340. In the second region 302 of the substrate 300, implanted ions 357 will come to a stop in the ion blocking mask 350 and/or the first overgrowth layer 340. In some embodiments, the ions in this region will not enter the base semiconductor layer 320. In other embodiments, some ions 357 may penetrate into the base semiconductor layer in the second region 302, but do not appreciably amorphize the layer. As a result, the base semiconductor layer 320 in the second region 302 will retain its crystalline form.

In various implementations, the combined thicknesses of the base semiconductor layer 320 and the first overgrowth layer 340 are sufficient to stop the implanted ions 357 before they reach the insulating layer 305 in the first region 301 of the substrate. According to some embodiments, the implanted ions 357 are prevented from reaching the insulating layer 305, so that they do not damage the insulating layer 305. In some implementations, some ions may reach the insulating layer 305.

Figure 3F:
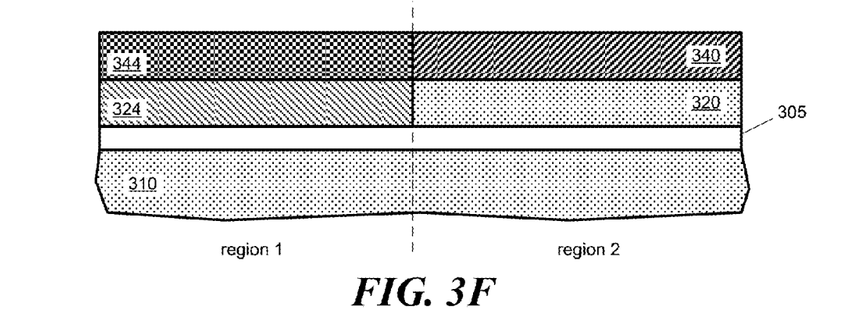

The ion blocking mask 350 may be removed from the substrate as depicted in FIG. 3F. The ion blocking mask 350 may be removed by any suitable method, which may include etching away the ion blocking mask with a reactive ion etching process, an oxidizing plasma, or dissolving the mask in a suitable to solvent.

The substrate 300 may then be subjected to an annealing step in which the substrate may be heated to a temperature above 500° C. According to some embodiments the annealing step may be carried out at a temperature between about 600° C. and about 1100° C. During the annealing step, the base semiconductor layer 320 in the first region 301 may re-crystallize. In various embodiments, the recrystallization of the base semiconductor layer 320 and first overgrowth layer 340 in the first region 301 may proceed from an upper exposed surface or region 344 of the first overgrowth layer and advance toward the insulating layer 305. Since the upper region 344 of the first overgrowth semiconductor layer 340 is in a relaxed state, the upper region of the overgrowth semiconductor layer will recrystallize in a relaxed state through the entire thickness of the first overgrowth semiconductor layer 340. Subsequently, a recrystallized region 324 of the base semiconductor layer 320 will recrystallize in a strained state. For example, if the first overgrowth semiconductor layer 340 comprises SiGe, then the recrystallized region 324 of the base semiconductor layer 320 will recrystallize in a state of tensile stress. As a result of the recrystallization, the base semiconductor layer 320 may contain adjacent regions 324, 320 of differently-strained semiconductor, as depicted in FIG. 3F. For example, recrystallized region 324 may be under tensile stress, and the semiconductor layer 320 in the second region 302 may have no stress.

According to some embodiments, the first overgrowth layer 340 may be removed from the substrate by any suitable process. For example, the first overgrowth semiconductor layer 340, including relaxed region 344, may be removed by an etching process. An example of one etching process may include a reactive ion etch comprising hydrochloric gas as an etchant. In another implementation, the first overgrowth semiconductor layer 340 may be removed using a chemical mechanical polishing process. In some implementations, a standard cleaning process or portion thereof (e.g., RCA/SC1/SC2) may be used to further clean the substrate. In this regard, a standard cleaning process may be implemented between any fabrications steps described in connection with FIGS. 3A-3M.

In some embodiments, the base semiconductor layer 320 including the recrystallized region 324 may be thinned after removal of the first overgrowth layer 340. In some implementations, the thinning of the base semiconductor layer 320 may be carried out using a chemical mechanical polishing process. In some implementations, the thinning of the base semiconductor layer 320 may be carried out using a timed etch-back process, e.g., a timed RIE.

Figure 3G:
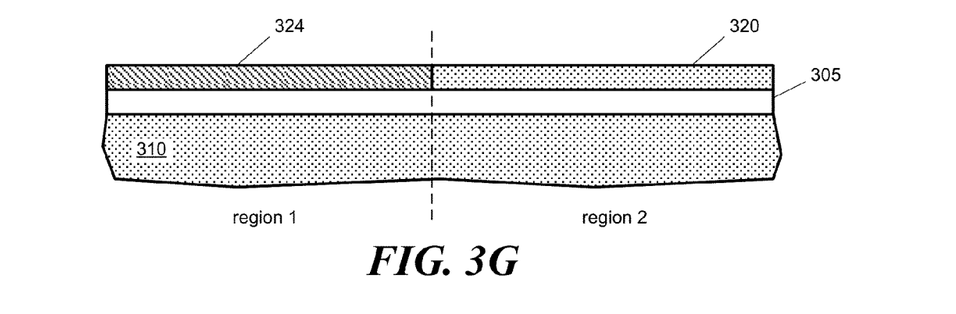

In some embodiments, the thinning of the base semiconductor layer may be carried out using an oxidation and etch-back process. For example, the base semiconductor layer 320 including the recrystallized region 324 may be partially oxidized, for example, to form a layer of silicon oxide. The oxidation process may be a thermal oxidation process that converts a portion of the base semiconductor layer into an oxide. Subsequently, the oxide portion may be removed by any suitable selective etching process including a dry etching process or a wet etching process. The selective etching process may use an etchant that removes the oxide at a significantly higher rate than the base semiconductor layer. Accordingly, the etching may effectively stop once the oxide is removed, so that precise timing of the etching is not required. The resulting thinned regions 324, 320 of the base semiconductor layer are depicted in FIG. 3G.

Figure 3H:
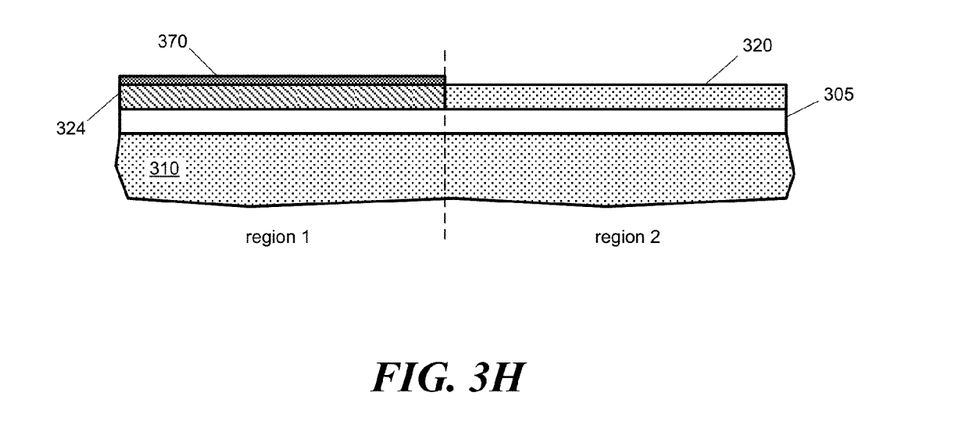

In various embodiments, a masking layer 370 may be formed over the recrystallized region 324 of the base semiconductor layer, as depicted in FIG. 3H. The masking layer 370 may be formed using any suitable material. In some embodiments, the masking layer 370 may be formed of an oxide or a nitride. In some embodiments, the masking layer 370 may be formed of multiple layers. For example, the masking layer 370 may be formed of an oxide layer immediately adjacent to a nitride layer. According to some embodiments, the masking layer 370 may be any suitable material that can withstand high thermal processing steps, e.g., temperatures up to about 800° C. in some embodiments, up to about 900° C. in some embodiments, up to about 1000° C. in some embodiments, and up to about 1200° C. in some embodiments.

The masking layer may be patterned using any suitable lithographic process, so as to cover the first region 301 of the substrate 300 and to expose the second region 302 of the substrate. For example, the masking layer 370 may be first deposited everywhere on the substrate region 330, and subsequently covered with a photoresist. The photoresist may be patterned using photolithography, so as to expose regions (e.g., region 301) of the masking layer. The exposed regions of the masking layer may be selectively etched to remove the exposed regions of the masking layer. In some embodiments the masking layer 370 may comprise a thin layer of silicon nitride and/or a thin layer of silicon oxide. The thickness of the masking layer 370 may be between about 5 nm and about 60 nm, according to some embodiments, though other thicknesses may be used in other embodiments.

Figure 3I:
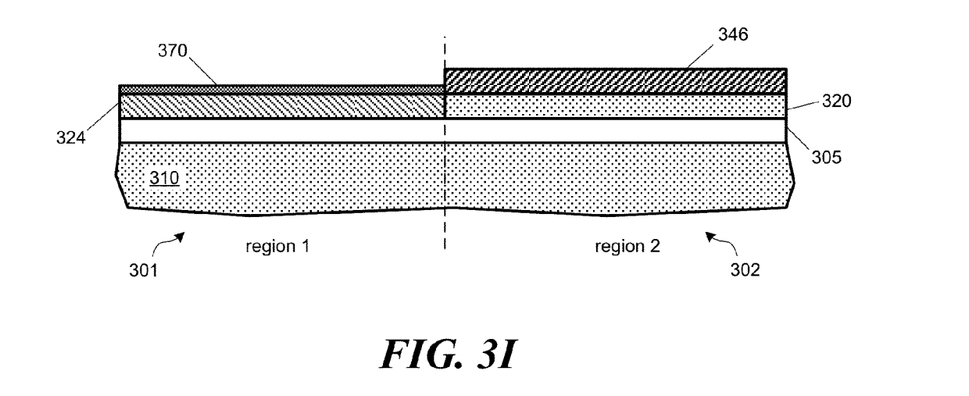

The substrate 300 may be subjected to a subsequent deposition step, so as to form a second overgrowth semiconductor layer 346 at the second region 302 of the substrate 300, as depicted in FIG. 3I. In some embodiments, the second overgrowth semiconductor layer 346 may be of the same chemical composition as the first overgrowth semiconductor layer 340. In other embodiments, the second overgrowth semiconductor layer may be formed of a material that has a different chemical composition than that of the first overgrowth semiconductor layer. According to some embodiments, the chemical composition of the second overgrowth semiconductor layer 346 is different from the composition of the underlying base semiconductor layer 320. For example, the second overgrowth semiconductor layer may be formed of SiGe or SiC, whereas the base semiconductor layer 320 is formed of Si.

In some embodiments, the second overgrowth semiconductor layer 346 may be formed by an epitaxial growth process. However, in some embodiments the second semiconductor layer 346 may be formed by any suitable means which may include a plasma vapor deposition process or a physical deposition process such as sputtering. In some embodiments the thickness of the second overgrowth semiconductor layer 346 may be between approximately 3 nm and approximately 50 nm. The second overgrowth semiconductor layer 346 may include a diffusive chemical species that, upon heating the substrate 300, will diffuse into the base semiconductor layer 320. In some embodiments, the concentration of the diffusive chemical species may be between approximately 10% and approximately 60% by atomic weight or by stoichiometric ratio. In some embodiments, a thin layer of oxide or nitride (not shown) may be deposited over the region 330 to stabilize the surface of the substrate during subsequent heating of the substrate. The thin layer of oxide or nitride may have a thickness between approximately 5 nm and approximately 30 nm.

In some embodiments, the defect density in the second semiconductor layer 346 may be higher than otherwise would normally be tolerated in a semiconductor device. For example, the defect density may be greater than $10^3$ defects/$cm^2$ in some embodiments, greater than $10^5$ defects/$cm^2$ in some embodiments, greater than $10^7$ defects/$cm^2$ in some embodiments, and yet greater than $10^9$ defects/$cm^2$ in some embodiments. In some implementations, the defect density may be greater than $10^{10}$ defects/$cm^2$. In some implementations, the defect density in the second overgrowth semiconductor layer may have a value less than $10^6$ defects/$cm^2$.

Figure 3J:
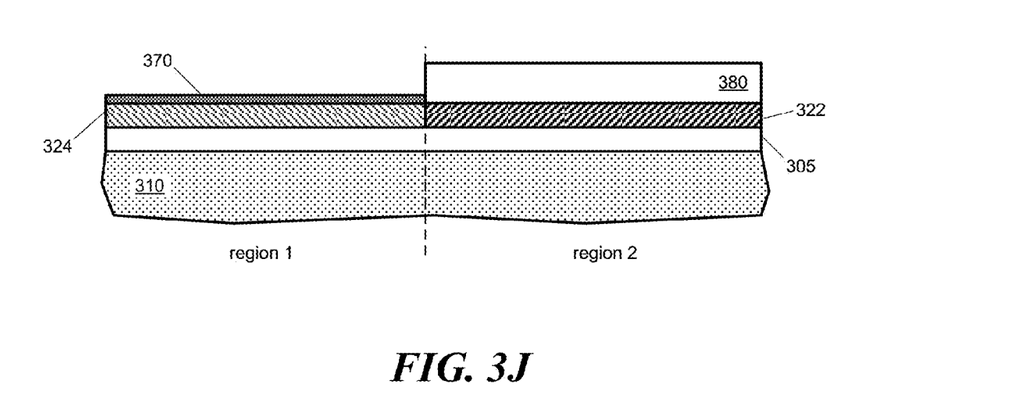

The substrate 300 may then be heated in a thermal condensation step to oxidize the second overgrowth semiconductor layer 346. According to some embodiments, the oxidation process will drive the diffusive chemical species (e.g., Ge) from the second overgrowth layer 346 into the base semiconductor layer 320 in the second region 302. The condensation process, may convert the remaining second overgrowth layer 346 into and oxide 380, as depicted in FIG. 3J. According to some embodiments, the oxidation process may be a timed step that is stopped when approximately all of the second overgrowth semiconductor layer 346 has been converted to an oxide. In some embodiments, a portion of the base semiconductor layer 320 may also be converted to an oxide.

During the heating and condensation process, the temperature of the substrate may be held below a melting point temperature of the overgrown semiconductor layer 346. The melting point temperature of the overgrown semiconductor layer 346 may depend upon a concentration of dopant in that layer. For example, if the overgrown semiconductor layer 346 comprises SiGe, the melting point temperature may be approximately 1400° C. for a low concentration of Ge, and may be about 1000° C. for a high concentration of Ge. In some embodiments, the temperature of the substrate may be held below approximately 90% of the melting point temperature of the overgrown semiconductor layer 346. In some embodiments, the temperature of the substrate may be held below approximately 80% of the melting point temperature of the overgrown semiconductor layer, or below 60% of the melting point temperature.

When the diffusive chemical species is driven into the base semiconductor layer, the introduction of the chemical species introduces strain in the base semiconductor layer. For example, germanium diffusing into crystalline silicon results in a SiGe semiconductor layer having compressive stress. The resulting converted region 322 of the base semiconductor layer is depicted in FIG. 3J. The concentration (by atomic weight or stoichiometry) of the diffusive species may be high in the converted region 322. In various embodiments, substantially all of the diffusive species is driven into the base semiconductor layer 320 during the oxidation process, so that the final concentration can be predetermined. In some embodiments, the final concentration of the diffusive species in the converted region 322 may be between approximately 10% and approximately 70%. In some implementations, the final concentration may be greater than 30%. In some implementations, the final concentration may be greater than 50%.

As can be inferred from FIG. 3J, the original base semiconductor layer 320 now contains two regions of differently-strained semiconductor material. In a first region 301, the recrystallized region 324 may have tensile stress, whereas the converted region 322 may have compressive stress. In some embodiments, the stresses are of opposite type, the regions 301, 302 are immediately adjacent each other, and the strained semiconductor is formed at a same level or from a same layer on the substrate 300.

Since the second overgrowth semiconductor layer 346 is formed separately from the first overgrowth semiconductor layer 340, strain that is induced in the converted region 322 is not constrained by the chemical composition of the first overgrowth semiconductor layer 340. The process of removal and regrowth of the second overgrowth semiconductor layer 346 enables greater flexibility and tailoring of the strain in the converted region 322. For example, the thickness of the first overgrowth semiconductor layer 340 and/or concentration of a diffusive chemical species in that layer may be limited by epitaxial growth conditions. Since the crystal lattice is persevered in the upper region 344 of the first overgrowth semiconductor layer 340 and later serves as a template for recrystallization of the base semiconductor layer 320 in the first region 301, the first overgrowth semiconductor layer 340 should be formed with low defect density. A low defect density may be any value below about $10^6$ cm$^{-2}$ in some embodiments, or below about $10^5$ cm$^{-2}$ in other embodiments.

To maintain low defect density, the thickness of the first overgrowth semiconductor layer 340 may be limited to between about 30 nm and about 60 nm, and the concentration of the diffusive species may be limited to concentrations up to about 50%. In some cases, the concentration of the diffusive species may be limited to about 30%. By separately forming the second overgrowth semiconductor layer 346, the concentration of the diffusive species in that layer may be increased to about 60% in some embodiments, or more in other embodiments. The separate forming of the second overgrowth semiconductor layer may allow higher strain values in the converted region 322 than would otherwise be possible using only the first overgrowth semiconductor layer 340. In some embodiments, strain in the converted region 322 is formed independently of the strain in the recrystallized region.

Figure 3K:
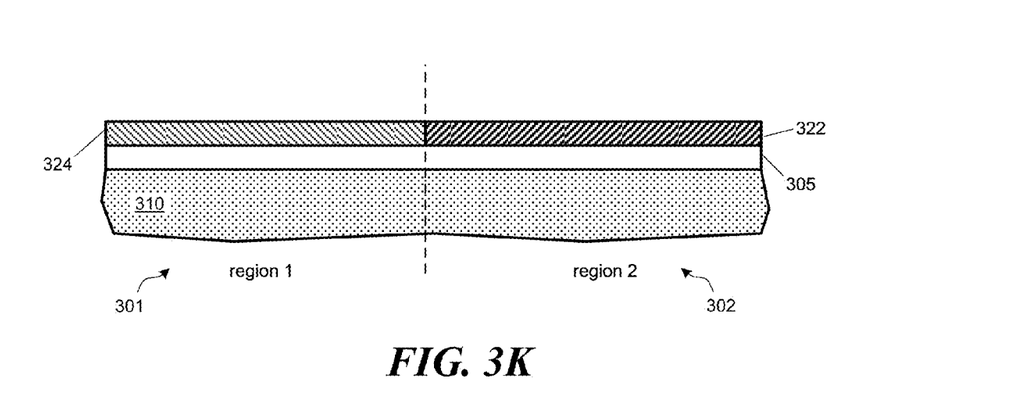
Figure 3L:
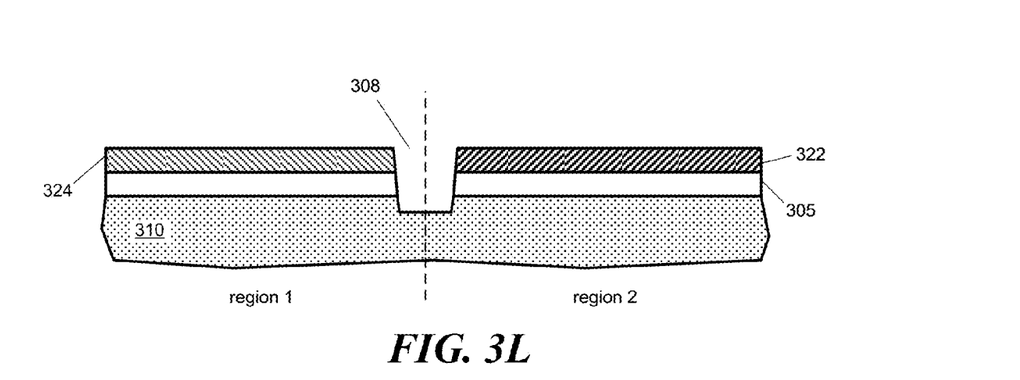

Referring to FIG. 3K, in various embodiments, the masking layer 370, the formed oxide layer 380, and any surface-stabilizing oxide or nitride may be removed from the substrate 300. The remaining regions of the base semiconductor layer may be anchored to the underlying insulating layer 305, so that the stresses formed in the base semiconductor layer from previous processing steps is retained. For example, the adjacent regions 324, 322 of the base semiconductor layer 320 are formed with opposite types of stress, and these stresses are retained in the layer after removal of the upper layers. In some embodiments, the adjacent regions 324, 322 may be formed with similar types of stress (e.g., both tensile) but have different values. In some embodiments, one region may be formed to have stress, and an adjacent region may be formed to have no stress.

Figure 3M:
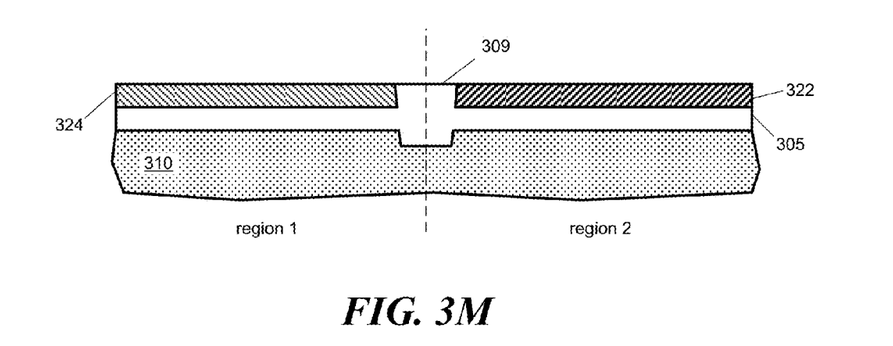

According to some embodiments, an insulating structure may be formed between the adjacent regions 324, 322 of differently-strained semiconductor layer 320. In some implementations, a trench 308 may be etched into the substrate 300 between the regions of differently-strained semiconductor. The trench 308 may be etched through the base semiconductor layer and into or through the insulating layer 305. In some embodiments, the trench 308 may be etched into the bulk material 310. The trench 308 may be subsequently filled with an electrically insulating material, as depicted in FIG. 3M. For example, an oxide or any other suitable insulator may be deposited in the trench 308 and over the surface of the substrate 300. The insulating material may be subsequently etched back or polished back using a selective etch or chemical mechanical polishing step to yield the trench isolation structure 309 shown in FIG. 3M. The etch-back or polish-back process may remove the insulating material from the strained semiconductor regions 324, 322, but leave the insulating material in the trench. According to some embodiments, a trench isolation structure 309 may be formed using any suitable shallow trench isolation (STI) process.

The etching of trenches 308 between adjacent regions of differently-strained semiconductor may serve two purposes. The trenches and isolation structure 309 can provide electrical isolation between the adjacent regions 324, 322 of differently-strained semiconductor. Additionally, the trenches may remove regions of semiconductor material that may exhibit higher defect densities than in active areas of the adjacent regions where devices will be formed. The higher defect densities may result from edge effects during the ion implantation step depicted in FIG. 3D.

In various embodiments, the recrystallized region 324 and the converted region 322 of the base semiconductor layer may be doped to have the same or different types of conductivity. The doping of the regions 324 and 322 may be carried out at any suitable point in the fabrication process. In some embodiments, the base semiconductor layer 320 may be initially doped to have a first type of conductivity, for example an n or p type conductivity. At a later time in the process, the converted region 322 may be doped to have a second type of conductivity, for example, a p or n type conductivity. The doping of the strained regions 324, 322 may produce regions of opposite conductivity types.

Variations of the fabrication process described in FIGS. 3A-3M are also contemplated. According to some embodiments, ion implantation and recrystallization may be carried out in both a first region and a second region to obtain differently strained regions of semiconductor material on a same layer of a substrate. For example, instead of growing and condensing SiGe in region 2 as depicted in FIGS. 3I-3K, a regrowth, ion implantation, and recrystallization process as depicted in FIGS. 3B-3F may be carried out. Instead of regrowing SiGe in region 2, SiC may be grown to yield a region of oppositely strained silicon.

In alternative implementations, SiGe and SiC may initially be formed in adjacent regions (SiGe in region 1 and SiC region 2, for example) on a substrate at a stage in the process corresponding to FIG. 3B. For example, a first mask may be formed to allow growth of SiGe in a first region and prevent growth in a second region, and a second mask may be formed to allow growth of SiC in the second region and prevent growth in the first region. Instead of forming an ion-blocking mask 350 at FIG. 3C, ion implantation and recrystallization may be performed simultaneously in both regions to yield underlying regions of oppositely or differently strained semiconductor material.

In some implementations, a trench 308 and/or trench isolation structure may be formed between first and second semiconductor regions prior to ion implantation. For example, a trench 308 may be formed prior to a processing step depicted in FIG. 3C or FIG. 3D.

Having differently strained regions of semiconductor material on a same layer of a substrate can be advantageous for CMOS FET circuitry. For example, a first type of FET (e.g., n-channel, Si FET) that benefits from increased carrier mobility according to a particular strain (tensile) may be located in a first region 301 where the recrystallized semiconductor layer 324 exhibits tensile strain. A second type of FET (p-channel) may be located at a second region 302 of the substrate where the converted semiconductor layer 322 exhibits compressive strain. Such localized strain control can enhance mobility of carriers in both types of FETs on the same substrate.

Figure 4A:
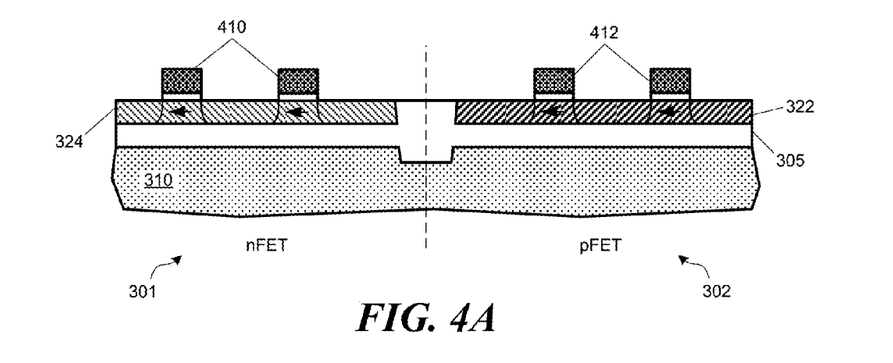
FIG. 4A depicts an embodiment of co-integrated, strained-channel FD-SOI FETs having compressive and tensile strain, according to some embodiments.

According to some embodiments, the adjacent regions of differently-strained semiconductor material may be used to form strained-channel FETs, e.g., finFETs and/or FD-SOI FETs. As depicted in FIG. 4A, n-channel FETs may be formed in the first region 301 of the substrate 301, and p-channel FETs may be formed in the second region 302 of the substrate. In some embodiments, the FETs may comprise FD-SOI FETs, as depicted in the drawing. For example, gate structures 410, comprising a gate conductor and a thin underlying insulator, may be formed in each region of the substrate. According to some embodiments, the doping of source and drain regions of the FETs may be carried out after formation of the gate structures 410 and 412, e.g., using a self-aligned ion implantation process.

Figure 4B:
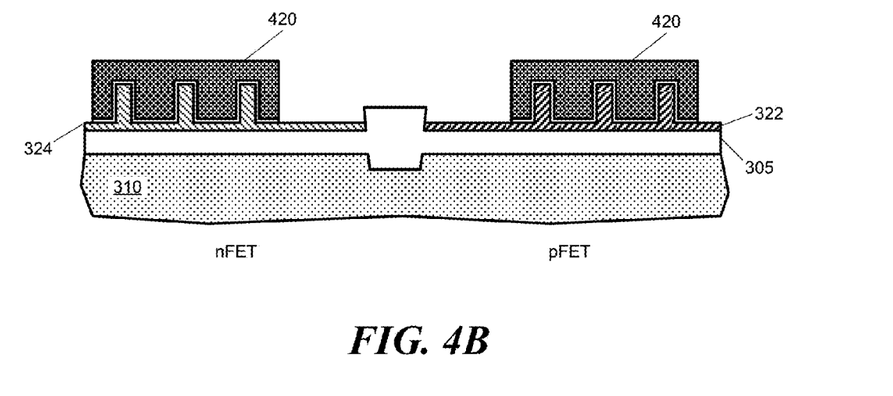
FIG. 4B depicts an embodiment of co-integrated, strained-channel finFETs having compressive and tensile strain, according to some embodiments.

In some embodiments, finFETs may be formed in the adjacent regions 324, 322 of differently-strained semiconductor, as depicted in FIG. 4B. For example, fins may be patterned into the base semiconductor layer 320, and gate structures 420 may be subsequently formed over the fins. In some embodiments, a gate structure 420 may be shared by two or more fins. The gate structures 420 may comprise a gate conductor formed over a thin insulating layer.

According to some embodiments, the forming of the fins for finFETs may include etching away a portion of the base semiconductor layer 320. The removal of the base semiconductor layer between the fins may result in substantially uniaxial stress oriented along the length of the fins. For example, the strained base semiconductor layer may relax in a direction perpendicular to the fins. In some embodiments, the orientation of the fins is selected with respect to the orientation of the crystal axes of the base semiconductor layer, so as to increase an enhancement of mobility of carriers within the strained channel regions of the fin FETs as compared to other orientations.

According to some embodiments, the orientation of fins may be selected with respect to a semiconductor's crystallographic orientation at the channel region, so as to improve carrier mobility. For a given semiconductor, carrier mobility may be increased to higher values when strain is directed along one crystallographic orientation as compared to another crystallographic orientation. Accordingly, a semiconductor may have a preferred strain direction (for uniaxial strain) or orientation (for multi-axial strain) that provides a higher mobility enhancement than other strain directions or orientations. According to some embodiments, a semiconductor may have a preferred axial strain type (e.g., uniaxial, biaxial, radial, etc.) that provides a higher mobility enhancement than other strain types. A strained-channel device may be fabricated such that it takes advantage of a preferred strain direction or orientation and/or a preferred strain type. For example, fins of finFETs and gate structures of FD-SOI FETs may be oriented so as to induce strain in a channel region of a transistor in a preferred strain direction or orientation.

The patterning of gate structures for FD-SOI FETs or of fins for finFETs may be done by any suitable high-resolution lithographic technique. Some applicable lithographic techniques include various forms of photolithography, x-ray lithography, or various techniques of imprint lithography. For patterning sub-40-nm channel FD-SOI or finFET devices, a sidewall image transfer (SIT) technique or mandrel process may be used. A sidewall image transfer process may be referred to as self-aligned double patterning (SADP) in some cases. In some implementations, fins or gate structures may be formed using a double patterning process, e.g., resist-on-resist patterning techniques (which may include a lithography-etch-lithography-etch (LELE) process or a lithography-freeze-lithography-etch (LFLE) process). In other embodiments, the fins or gate structures may be formed by interferometric lithography, imprint lithography, photolithography, extreme ultraviolet lithography, or x-ray lithography.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips.

Although some of the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors and nanowire transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A substrate comprising:
a first region having a first strain in a first semiconductor layer that is disposed on an insulating layer; and
a second region in the first semiconductor layer having a second strain;
an n-channel finFET formed in the first region; and
a p-channel finFET formed in the second region;
the second region of the first semiconductor layer having a diffusive semiconductor species therein providing a chemical composition different from that of the first region and so that the type of strain in the second region is opposite the type of strain in the first region, and a magnitude of the second strain being greater than a magnitude of the first strain;
the first region defining a plurality of respective fins for the n-channel finFET, and the second region defining a plurality of respective fins for the p-channel finFET.

2. The substrate of claim 1, wherein the second region has a concentration of the diffusive semiconductor species in the second region of more than approximately 30%.

3. The substrate of claim 1, wherein the second region has a concentration of the diffusive semiconductor species in the second region of more than approximately 50%.

4. The substrate of claim 1, wherein the first type of strain is tensile and the second type of strain is compressive.

5. The substrate of claim 1, wherein the chemical composition of the first region comprises Si.

6. The substrate of claim 1, wherein the chemical composition of the second region comprises a compound semiconductor.

7. The substrate of claim 1, wherein a width of the fins is less than about 30 nm.

8. The substrate of claim 1
wherein the n-channel finFET and the p-channel FINFET comprise FD-SOI finFETs.

9. The substrate of claim 8, wherein the first type of strain is tensile and the second type of strain is compressive.

10. A substrate comprising:
a first region in a first semiconductor layer disposed on an insulating layer having a first strain;
a second region in the first semiconductor layer having a diffusive semiconductor species therein providing a second strain different from the first strain and a chemical composition that is different from that of the first region;
a third semiconductor layer formed in contact with the second region and not the first region and having a chemical component that is also present in the second region of the first semiconductor layer and is not present in the first region of the first semiconductor layer;
an n-channel finFET formed in the first region; and
a p-channel finFET formed in the second region;
the first region defining a plurality of respective fins for the n-channel finFET, and the second region defining a plurality of respective fins for the p-channel finFET.

11. The substrate of claim 10, further comprising an oxide layer formed at a surface of the third semiconductor layer that is opposite a surface of the third semiconductor layer that is in contact with the second region in the first semiconductor layer.

12. The substrate of claim 10, wherein the third semiconductor layer comprises a compound semiconductor.

13. The substrate of claim 10, wherein the third semiconductor layer comprises at least one of SiGe and SiC, and the first region comprises Si.

* * * * *